United States Patent
Marakhtanov et al.

(10) Patent No.: US 10,181,412 B2
(45) Date of Patent: *Jan. 15, 2019

(54) NEGATIVE ION CONTROL FOR DIELECTRIC ETCH

(71) Applicant: Lam Research Corporation, Fremont, CA (US)

(72) Inventors: Alexei Marakhtanov, Albany, CA (US); Mirzafer K. Abatchev, Fremont, CA (US); Rajinder Dhindsa, San Jose, CA (US); Eric Hudson, Berkeley, CA (US); Andrew D. Bailey, III, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 572 days.

This patent is subject to a terminal disclaimer.

(21) Appl. No.: 14/827,052

(22) Filed: Aug. 14, 2015

(65) Prior Publication Data

US 2015/0357209 A1 Dec. 10, 2015

Related U.S. Application Data

(62) Division of application No. 13/188,421, filed on Jul. 21, 2011, now Pat. No. 9,117,767.

(51) Int. Cl.
*C23C 14/34* (2006.01)
*C23C 16/505* (2006.01)
(Continued)

(52) U.S. Cl.
CPC ...... *H01L 21/67069* (2013.01); *C23C 14/345* (2013.01); *H01J 37/32091* (2013.01);
(Continued)

(58) Field of Classification Search
CPC ............. C23C 14/345; C23C 14/3471; C23C 14/3485; C23C 14/54; C23C 14/5826;
(Continued)

(56) References Cited

U.S. PATENT DOCUMENTS 3,849,276 A 11/1974 Greiner
5,658,418 A * 8/1997 Coronel ............ H01J 37/32935
156/345.25

(Continued)

FOREIGN PATENT DOCUMENTS

CN 101088147 A 12/2007
CN 101557885 A 10/2009
(Continued)

OTHER PUBLICATIONS

Thin Solid Films 407 (2002) 198-203; Behaviors of electron and negative-ion densities in low-pressure high-density inductively coupled plasmas of SF6, NF3, CF4, and C4F8 gases diluted with Ar. Akihiro Kono, Masahito Konishi, Kenji Kato Dec. 31, 2002; 6 pages.

*Primary Examiner* — Jeffrie R Lund
*Assistant Examiner* — Stanislav Antolin
(74) *Attorney, Agent, or Firm* — Martine Penilla Group, LLP

(57) ABSTRACT

Apparatus, methods, and computer programs for semiconductor processing in a capacitively-coupled plasma chamber are provided. A chamber includes a bottom radio frequency (RF) signal generator, a top RF signal generator, and an RF phase controller. The bottom RF signal generator is coupled to the bottom electrode in the chamber, and the top RF signal generator is coupled to the top electrode. Further, the bottom RF signal is set at a first phase, and the top RF signal is set at a second phase. The RF phase controller is operable to receive the bottom RF signal and operable to set the value of the second phase. Additionally, the RF phase controller is operable to track the first phase and the second phase to (Continued)

maintain a time difference between the maximum of the top RF signal and the minimum of the bottom RF signal at approximately a predetermined constant value, resulting in an increase of the negative ion flux to the surface of the wafer.

16 Claims, 13 Drawing Sheets

(51) Int. Cl.
 H01J 37/32 (2006.01)
 H01L 21/3065 (2006.01)
 H01L 21/311 (2006.01)
 H01L 21/67 (2006.01)
 H01L 21/66 (2006.01)
 H05H 1/46 (2006.01)

(52) U.S. Cl.
 CPC .. *H01J 37/32137* (2013.01); *H01L 21/31116* (2013.01); *H01L 22/20* (2013.01); *C23C 16/505* (2013.01); *H01J 2237/334* (2013.01); *H01J 2237/3343* (2013.01); *H01J 2237/3348* (2013.01); *H01L 21/3065* (2013.01); *H05H 2001/4675* (2013.01)

(58) Field of Classification Search
 CPC ............ C23C 14/5837; C23C 16/4405; C23C 16/503–16/509; C23C 16/515; C23C 15/52; H01J 2237/334; H01J 2237/3341; H01J 2237/3348; H01J 37/04; H01J 37/32045; H01J 37/32082; H01J 37/32091; H01J 37/321; H01J 37/32137; H01J 37/32146; H01J 37/32155; H01J 37/32165; H01J 37/32174; H01J 37/32183; H01J 37/32422; H01J 37/32432; H01J 37/32532; H01J 37/32697; H01J 37/32706; H01J 37/32862; H01J 37/32935–37/32972; H01J 37/3299; H01J 37/334; H01J 37/3344; H01J 37/3348; H01L 21/3065; H01L 21/31116; H01L 21/31138; H01L 21/32136; H01L 21/67063; H01L 21/67069; H01L 22/20–22/26; H03F 2200/387; H03H 7/38; H03H 7/40; H05H 1/46; H05H 1/4645; H05H 1/4675; H05H 5/047
 See application file for complete search history.

(56) References Cited

U.S. PATENT DOCUMENTS

| | | | | |
|---|---|---|---|---|
| 5,779,925 A * | 7/1998 | Hashimoto | ....... | H01J 37/32137 216/41 |
| 5,872,443 A * | 2/1999 | Williamson | ........ | H01M 10/425 320/160 |
| 6,017,825 A * | 1/2000 | Kim | ....................... | H01J 37/321 216/68 |
| 6,328,845 B1 * | 12/2001 | Ohmoto | ............ | H01J 37/32192 156/345.44 |
| 6,875,366 B2 | 4/2005 | Sumiya et al. | | |
| 7,838,426 B2 | 11/2010 | Goyal et al. | | |
| 9,117,767 B2 * | 8/2015 | Marakhatanov | .. | H01J 37/32091 |
| 2002/0031617 A1 * | 3/2002 | Sumiya | ............... | C23C 16/4401 427/569 |
| 2002/0103563 A1 * | 8/2002 | Izawa | ............. | G05B 19/41875 700/121 |
| 2002/0125207 A1 * | 9/2002 | Ono | .......................... | C23F 4/00 216/2 |
| 2002/0139658 A1 * | 10/2002 | Kanakasabapathy | ........................ | H01J 37/321 204/164 |
| 2005/0115677 A1 | 6/2005 | Nagahata et al. | | |
| 2006/0073700 A1 * | 4/2006 | Brown | ................... | C23C 14/046 438/643 |
| 2007/0037300 A1 * | 2/2007 | Qin | ........................ | G01N 21/73 438/14 |
| 2007/0095788 A1 * | 5/2007 | Hoffman | ........... | H01J 37/32174 216/59 |
| 2007/0164237 A1 * | 7/2007 | Bernhardt | ............. | H01J 37/248 250/492.21 |
| 2008/0053818 A1 * | 3/2008 | Ui | ..................... | H01J 37/32091 204/164 |
| 2008/0083502 A1 | 4/2008 | Heo et al. | | |
| 2009/0114244 A1 * | 5/2009 | Sexton | .................. | B08B 7/0035 134/1.1 |
| 2009/0194508 A1 * | 8/2009 | Ui | ..................... | H01J 37/32027 216/67 |
| 2009/0291562 A1 * | 11/2009 | Jensen | ................. | H01L 21/0273 438/710 |
| 2010/0006225 A1 * | 1/2010 | Yokogawa | ........ | H01J 37/32642 156/345.28 |
| 2010/0175832 A1 * | 7/2010 | Nishio | ................... | H01J 37/321 156/345.49 |
| 2010/0175833 A1 * | 7/2010 | Nishio | .................. | H01J 37/321 156/345.49 |
| 2010/0243883 A1 * | 9/2010 | Vidal-De-Miguel | ........................ | G01N 27/624 250/282 |
| 2010/0248488 A1 * | 9/2010 | Agarwal | ........... | H01J 37/32091 438/714 |
| 2010/0253224 A1 * | 10/2010 | Marakhtanov | .... | H01J 37/32009 315/111.41 |
| 2010/0276391 A1 | 11/2010 | Grimbergen et al. | | |
| 2010/0315064 A1 * | 12/2010 | Kuthi | .................... | H01J 37/321 324/111 |
| 2011/0031216 A1 * | 2/2011 | Liao | .................. | H01J 37/32082 216/67 |
| 2011/0094994 A1 * | 4/2011 | Todorow | ............... | H01J 37/321 216/68 |
| 2011/0097901 A1 * | 4/2011 | Banna | .................... | H01J 37/321 438/710 |
| 2011/0137446 A1 * | 6/2011 | Valcore, Jr. | ........ | H01J 37/32082 700/108 |
| 2011/0234100 A1 * | 9/2011 | Tomita | ............... | H01J 37/32091 315/111.21 |
| 2011/0248634 A1 * | 10/2011 | Heil | .................. | H01J 37/32009 315/111.41 |
| 2013/0009545 A1 * | 1/2013 | Benjamin | ......... | H01J 37/32082 315/111.21 |
| 2013/0023064 A1 * | 1/2013 | Marakhtanov | .... | H01J 37/32091 438/5 |
| 2013/0243966 A1 * | 9/2013 | Schett | .................... | C23C 14/48 427/523 |

FOREIGN PATENT DOCUMENTS

| | | | | |
|---|---|---|---|---|
| CN | 101627461 A | 1/2010 | | |
| CN | 101978461 A | 2/2011 | | |
| DE | 102010060910 A1 * | 5/2012 | ............. | C23C 14/48 |
| TW | 200947494 A1 | 11/2009 | | |
| WO | WO-2009115135 A1 * | 9/2009 | ........ | H01J 37/32009 |
| WO | WO-2012073142 A2 * | 6/2012 | ............. | C23C 14/48 |
| WO | WO-2013006759 A1 * | 1/2013 | .......... | H01J 3/32082 |

* cited by examiner

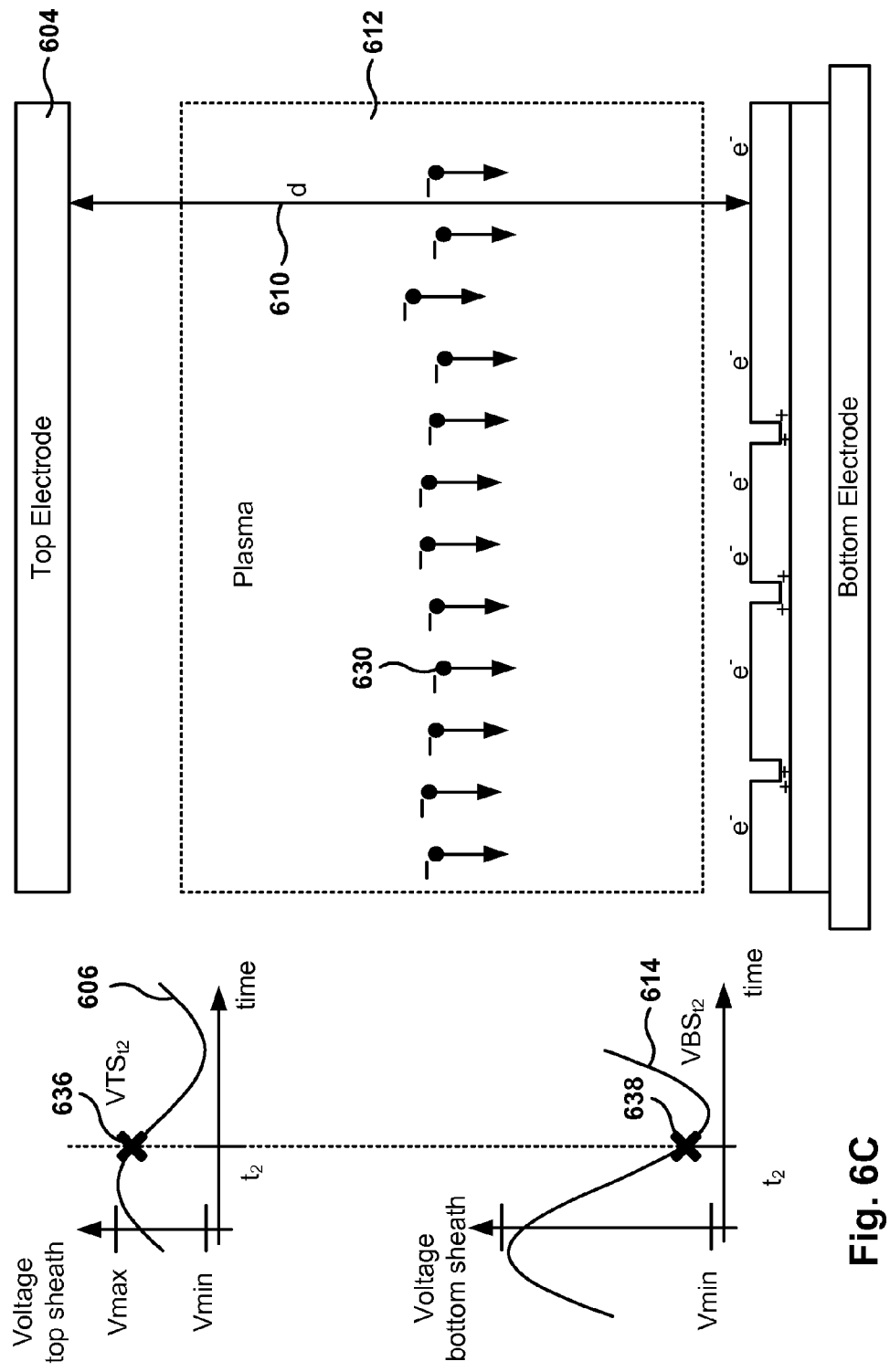

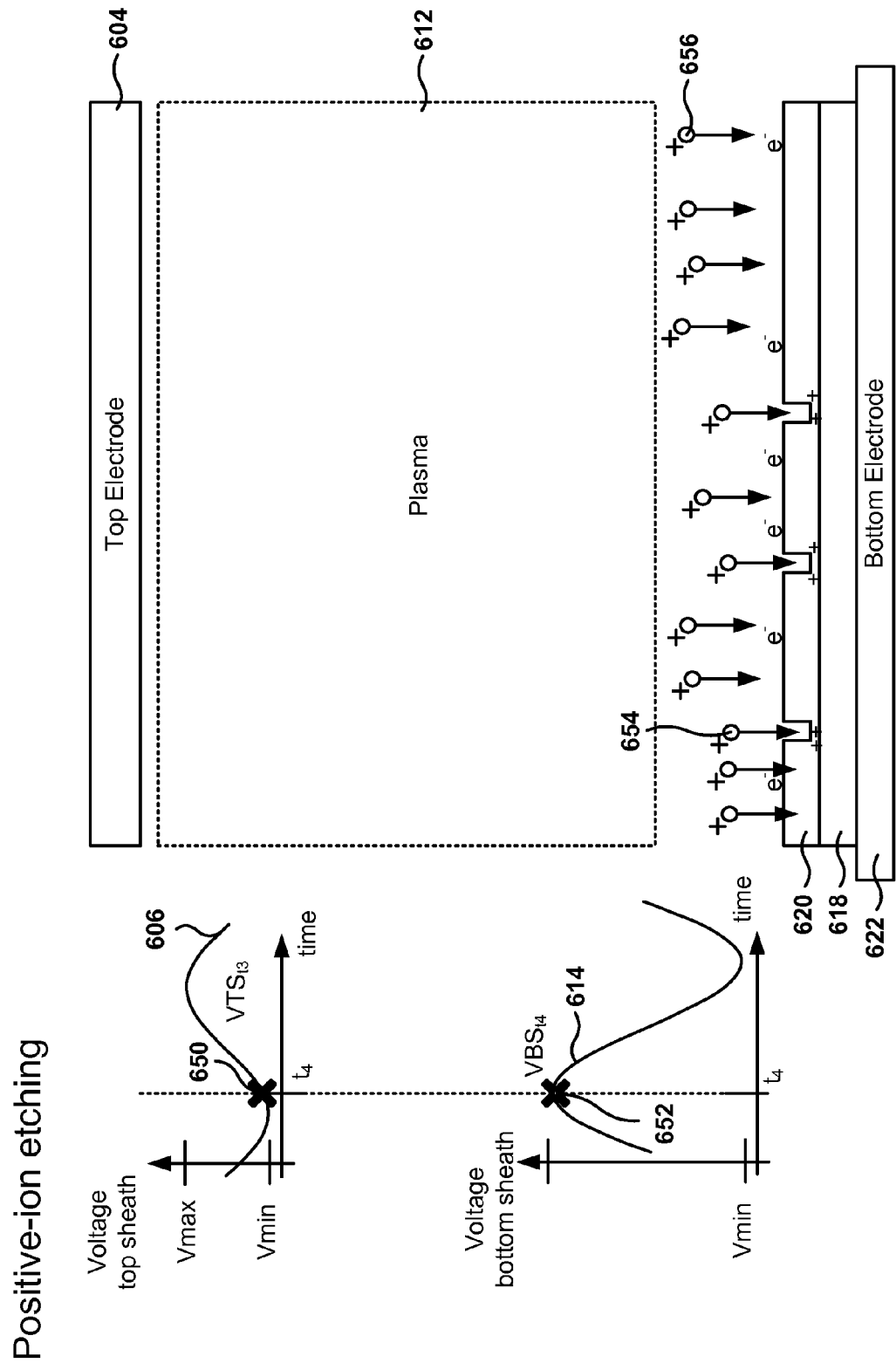

NEGATIVE ION CONTROL FOR DIELECTRIC ETCH

CLAIM OF PRIORITY

This application is a Divisional application of U.S. patent application Ser. No. 13/188,421, filed on Jul. 21, 2011, and entitled, "NEGATIVE ION CONTROL FOR DIELECTRIC ETCH," which is herein incorporated by reference.

BACKGROUND

1. Field of the Invention

The present invention relates to methods, systems, and computer programs for facilitating dielectric etching of a semiconductor device, and more particularly, methods, systems, and computer programs for facilitating negative ion control in a capacitively-coupled plasma (CCP) chamber.

2. Description of the Related Art

The manufacturing of integrated circuits includes immersing silicon substrates (wafers) containing regions of doped silicon into chemically-reactive plasmas, where the submicron device features (e.g., transistors, capacitors, etc.) are etched onto the surface. Once the first layer is manufactured, several back-end insulating (dielectric) layers are built on top of the first layer, where holes (also referred to as vias) and trenches are etched into the material for placement of the conducting interconnectors.

$SiO_2$ is a common dielectric used in semiconductor manufacturing. The plasmas used for $SiO_2$ etching often include fluorocarbon gases such as carbon tetrafluoride $CF_4$ and otafluorocyclobutane ($C—C_4F_8$), along with argon (Ar) and oxygen ($O_2$) gases. The word plasma is used to refer to those gases in which the constituent atoms and molecules have been partially or wholly ionized. Capacitive radio frequency (RF) power coupling is often used for striking and sustaining the plasma because of the low dissociation rates obtained, favoring larger passivating molecules and high ion energies at the surface. To obtain independent control of the ion energy and the ion flux to the silicon substrate, dual frequency capacitive discharges (DF-CCP) are sometimes used.

Etching of the wafer is often performed by positive ions when the positive ions escape from the plasma and strike the feature to be etched. Some etching methods also rely on negative-ion etching by pulsing the plasma, i.e. having periods were the RF power supply is turned off, which enables the escaping of negative ions from the plasma during the off period of the RF (also referred to as the afterglow). However, pulsing the RF power supply is not an efficient way of etching, because the plasma is being created and dissipated in each cycle.

It is in this context that embodiments arise.

SUMMARY

Embodiments of the present invention provide methods, systems, and computer programs for negative ion control in a capacitively-coupled plasma chamber. Embodiments enable the flux of both positive and negative ions to the surface of the wafer for feature-charging control.

It should be appreciated that the present invention can be implemented in numerous ways, such as a process, an apparatus, a system, a device or a method on a computer readable medium. Several inventive embodiments of the present invention are described below.

In one embodiment, a capacitively-coupled plasma chamber is provided. The chamber includes a bottom radio frequency (RF) signal generator, a top RF signal generator, and an RF phase controller. The bottom RF signal generator is coupled to the bottom electrode in the chamber, and the top RF signal generator is coupled to the top electrode. Further, the bottom RF signal is set at a first phase, and the top RF signal is set at a second phase. The RF phase controller is operable to receive the bottom RF signal and operable to set the value of the second phase. Additionally, the RF phase controller is operable to track the first phase and the second phase to maintain a time difference between the maximum of the top RF signal and the minimum of the bottom RF signal at approximately a predetermined constant value.

In another embodiment, a method for operating a capacitively-coupled plasma chamber is presented. The method includes operations for applying a bottom radio frequency (RF) signal set at a first phase to a bottom electrode in the chamber, and for measuring the first phase of the bottom RF signal. Further, the method includes an operation for applying a top RF signal set at a second phase to a top electrode in the chamber. The first phase and the second phase are tracked to maintain a time difference between a maximum of the top RF signal and a minimum of the bottom RF signal at approximately a constant predetermined value.

In yet another embodiment, a capacitively-coupled plasma chamber includes a bottom radio frequency (RF) signal generator coupled to a bottom electrode, and an RF phase controller. The bottom RF signal is set at a first phase, and the RF phase controller is operable to receive the bottom RF signal. Further, the RF phase controller is operable to generate a top RF signal set at a second phase for a top electrode. The RF phase controller is operable to track the first phase and the second phase to maintain a time difference between a maximum of the top RF signal and a minimum of the bottom RF signal at a predetermined value.

Other aspects will become apparent from the following detailed description, taken in conjunction with the accompanying drawings.

BRIEF DESCRIPTION OF THE DRAWINGS

The invention may best be understood by reference to the following description taken in conjunction with the accompanying drawings.

FIGS. 6A-6E illustrate the operation of the etching chamber at different times in the RF power cycle, according to one embodiment.

DETAILED DESCRIPTION

Embodiments of the invention perform substrate etching utilizing negative ions. The top electrode is powered with a low frequency radio frequency (RF) whose is phase is controlled based on the phase of another low frequency RF applied to the bottom electrode. Negative ions born at the top sheath travel through the plasma bulk, and approach the wafer surface when the bottom sheath potential is approximately at a minimum.

It will be apparent, that the present embodiments may be practiced without some or all of these specific details. In other instances, well known process operations have not been described in detail in order not to unnecessarily obscure the present embodiments.

Figure 1:
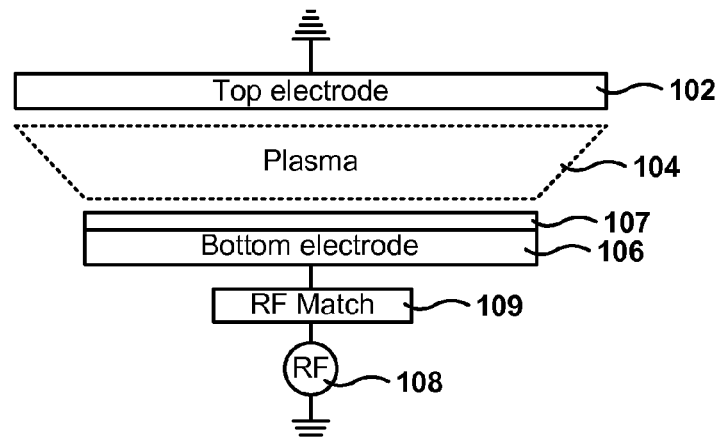
FIG. 1 shows an asymmetric etching chamber, according to one embodiment.

FIG. 1 shows an asymmetric etching chamber, according to one embodiment. Exciting an electric field between two electrodes is one of the methods to obtain RF gas discharge in an etching chamber. When an oscillating voltage is applied between the electrodes, the discharge obtained is referred to as a capacitive coupled plasma (CCP) discharge.

Plasma can be created utilizing stable feedstock gases to obtain a wide variety of chemically reactive by-products created by the dissociation of the various molecules caused by electron-neutral collisions. The chemical aspect of etching involves the reaction of the neutral gas molecules and their dissociated by-products with the molecules of the to-be-etched surface, and producing volatile molecules, which can be pumped away. When plasma is created, the positive ions are accelerated from the plasma across a space-charge sheath separating the plasma from the walls, to strike the wafer surface with enough energy to remove material from the surface of the wafer. This is known as ion bombardment or ion sputtering. Some industrial plasmas, however, do not produce ions with enough energy to efficiently etch a surface by purely physical means. It has been proven that the combined actions of both neutral-gas etching and ion bombardment produces a faster etch rate than simply adding the effects of each method.

In one embodiment, Fluorocarbon gases, such as $CF_4$ and $C\text{---}C_4F_8$, are used in the dielectric etch process for their anisotropic and selective etching capabilities, but the principles of the invention can be applied to other plasma-creating gases. The Fluorocarbon gases are readily dissociated into smaller molecular and atomic radicals. These chemically reactive by-products etch away the dielectric material, which in one embodiment can be $SiO_2$ or SiOCH for low-k devices.

FIG. 1 illustrates an asymmetric chamber with top electrode 102, plasma 104 that is created during the operation of the chamber, and bottom electrode 106. In this embodiment, the top electrode 102 is connected to ground, and the bottom electrode 106 is connected to RF power supply 108 via RF match 109. The substrate, or wafer 107 is placed on bottom electrode 106. The top sheath is larger than the bottom sheath, because of the geometrical asymmetry in the size of the electrodes, i.e., top electrode 102 is bigger than bottom electrode 106.

Figure 2:
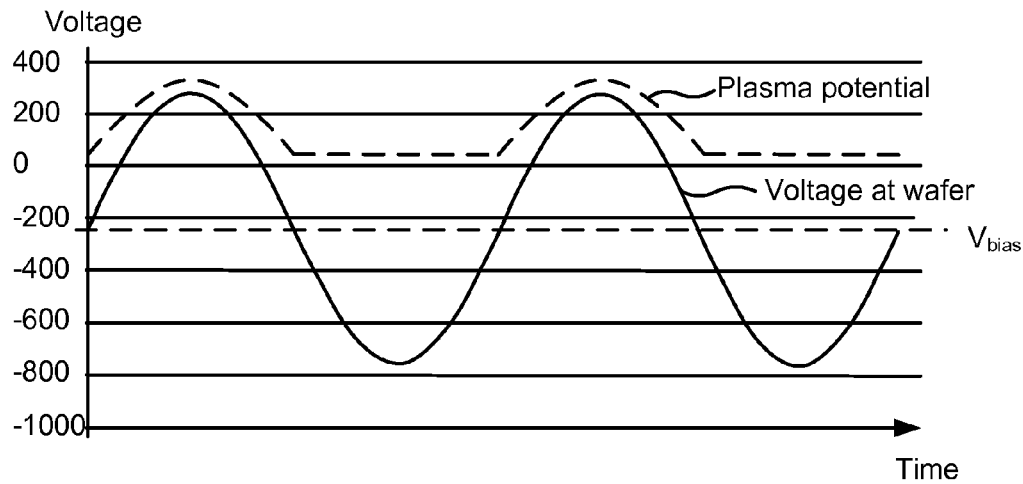
FIG. 2 shows the plasma and wafer potentials over time, according to one embodiment.

FIG. 2 shows the plasma and wafer potentials over time, according to one embodiment. In a typical symmetric system, electrodes have the same size and the wafer DC bias is 0 V. When the area of top electrode is increased, an asymmetry is created in the plasma. The sheath at the wafer is increased, resulting in higher ion energies at the wafer. The wear rate of the grounded parts facing the plasma is reduced due to the lower plasma potential, which causes lower ion bombardment energies at the grounded surface.

Fluorocarbons, being halogen derived gases, can produce significant quantities of negative ions. For more information on the production of negative ions, please refer to *Thin Solid Films*, Kono et al, 2002, p. 198-203, which is herein incorporated by reference. The presence of negative ions can modify the plasma structure and result in a reduction of the positive ion flux leaving the plasma. However, if the negative ions are capable of reaching the substrate, then the negative ions may also participate in the etching process.

FIG. 2 shows a chart for the voltages of the chamber in FIG. 1. The voltage at the wafer corresponds to the RF signal generated at the bottom electrode, which has a negative DC bias voltage $V_{bias}$. The plasma potential is positive with respect to ground and follows the shape of the voltage at the wafer, except that the plasma potential has a flat-bottom shape due to the asymmetry of the chamber.

Figure 3:
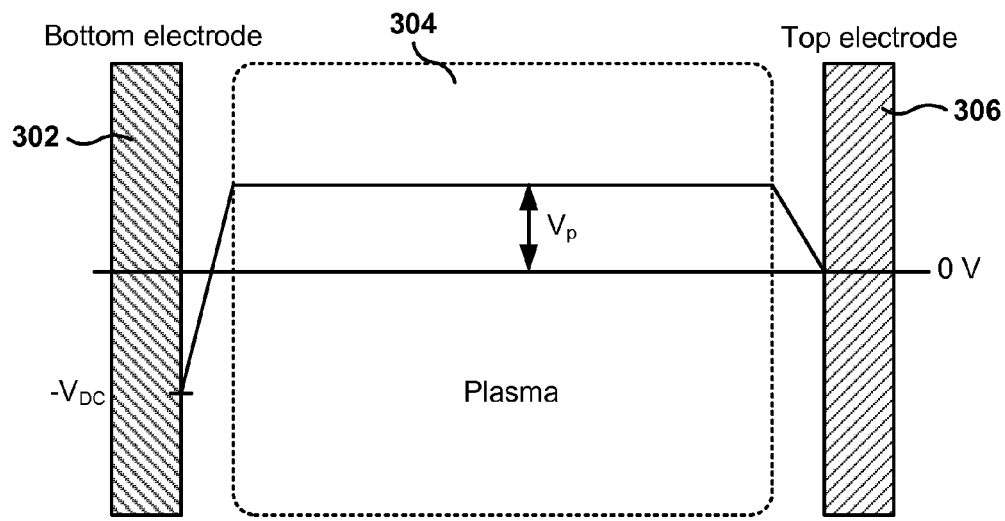
FIG. 3 illustrates the electrode and plasma potential for the chamber of FIG. 1, according to one embodiment.

FIG. 3 illustrates the electrode and plasma potential for the chamber of FIG. 1, according to one embodiment. In the CCP chamber, the capacitance created is not between the electrodes directly, but rather between the electrodes and the plasma, i.e. across the sheaths. The sheaths are, to a good approximation, electron free and act as potential barriers for plasma negative species, such as electrons and negative ions, only ion and RF displacement currents to pass.

As a consequence of sheath formation, the plasma 304 is at a positive potential with respect to ground. As the sheath is a layer of charge separation, the ions entering this space charge region must gain enough energy to break free from the quasi-neutral plasma. In the chamber of FIG. 3, the top electrode 306 is at ground potential, the plasma is at a positive potential $V_p$, and the bottom electrode 302 has a DC bias with negative potential $-V_{DC}$.

Figure 4:
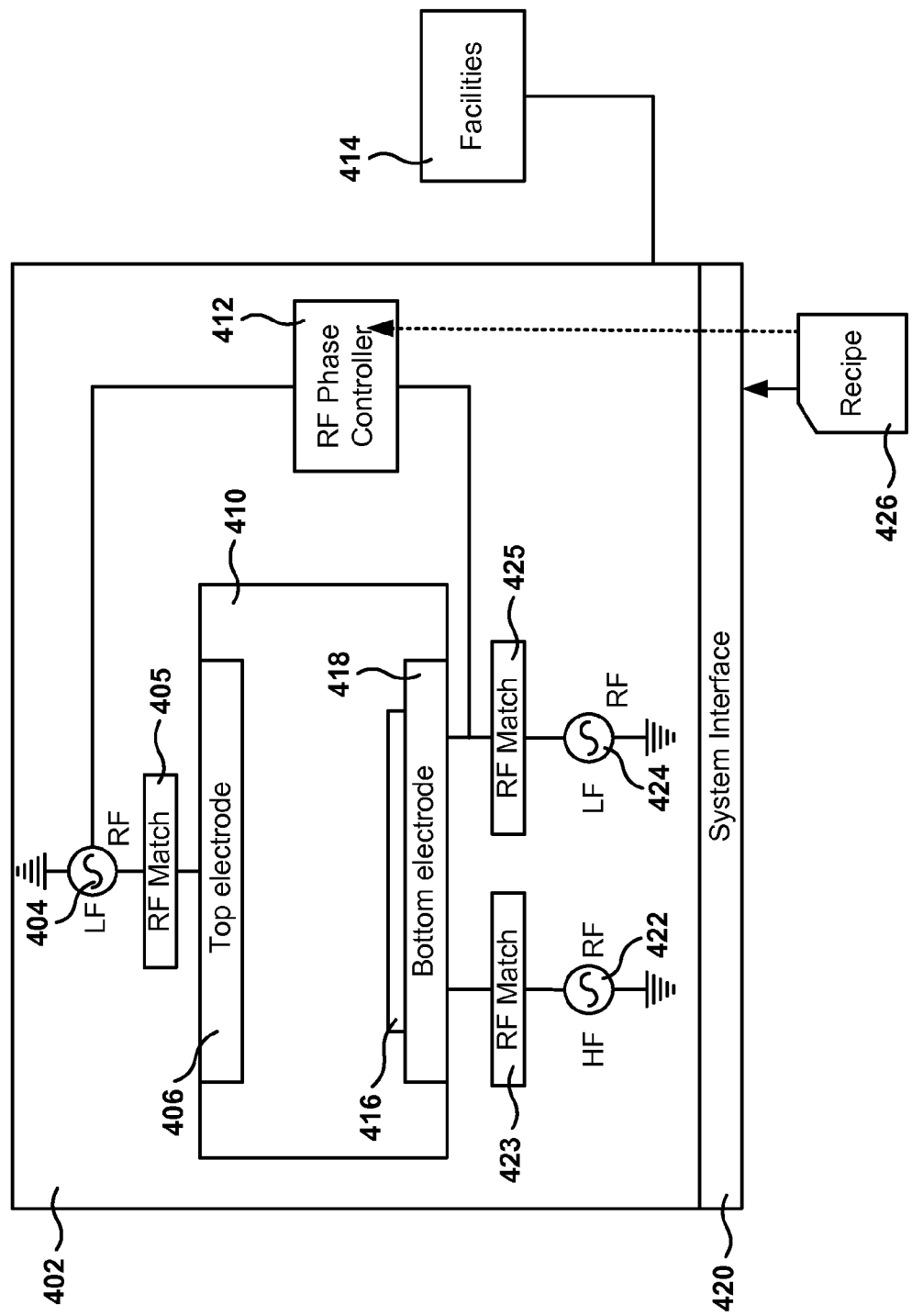
FIG. 4 shows a capacitively-coupled plasma (CCP) chamber with negative ion control, according to one embodiment.

FIG. 4 shows a capacitively-coupled plasma (CCP) chamber with negative ion control, according to one embodiment. One characteristic of plasma etching is the ability to etch anisotropically, that is, in a single direction. This is the result of the synergy between the ions and the surface chemistry. As the ions are accelerated by a uni-directional electric field across the sheath, the direction of the ions on impact is primarily perpendicular to the surface. If the surface to be etched is covered with a patterned mask (e.g., photoresist), the areas unprotected by the mask will be etched in a mainly vertical direction.

Negative ions play a significant role in surface charge control and the etch rate in dielectric etch processes. In a typical asymmetric capacitive discharge, negative ions do not usually reach the surface of the wafer since they are trapped in the plasma bulk by the sheath potential. Low energy negative ions born in the plasma bulk cannot escape from plasma, but high energy negative ions generated at expanding sheaths can cross the plasma bulk and reach the surface of the opposite electrode. For more information, please refer to *Journal of Applied Physics* Volume 79 (12), Zeuner at al., 15 Jun. 1996, p. 9379, which is herein incorporated by reference. In asymmetrical discharge, negative ions born at high voltage (powered electrode) sheath can escape to the lower voltage grounded upper electrode.

Some existing methods utilize a pulsing RF power source. When plasma is in the off period (referred to as the afterglow), the negative ion density increases due to low temperature electron attachment to neutrals. The negative ions escape to the walls and neutralize positive charges that may be have accumulated on the walls during the RF on period. However, by pulsing the RF, the overall flux of positive ions to the substrate drops, resulting in slower etch rates.

In a single high frequency (e.g., 60 MHz) plasma with relatively low sheath potentials, negative ions cannot escape from the plasma to the smaller-area powered electrode. However, in a dual frequency chamber with high and low frequency RF sources (e.g, 27 MHz and 2 MHz) some negative ions escape the plasma bulk due to higher sheath potentials. For more information, please refer to *Journal of Applied Physics* Volume 94 (6), Georgieva et al., 15 Sep. 2003, p. 3748, which is herein incorporated by reference. The motivation for dual frequency sources is the independent control of the ion flux and the ion energy. The high frequency source controls the ion flux, and the low frequency source controls the ion energy. Embodiments of the invention increase the number of negative ions that reach the wafer for processing.

FIG. 4 shows a semiconductor manufacturing tool 402 with a capacitively-coupled, parallel-plate chamber 410. The bottom electrode 418 is powered by a high frequency RF power generator 422 trough RF match 423, and by a low frequency RF power generator 424 trough RF match 425. Wafer 416 is disposed above bottom electrode 418 during processing. The top electrode 406 is powered by a low frequency RF power generator 404 through RF match 405. In one embodiment, a 32 mm gap separates both electrodes, but other gap values are also possible, such as values between 15 mm and 100 mm, or more. In one embodiment, the low frequency is 2 MHz and the high frequency is 27 MHz, but other values are also possible. For example, the low frequency can be any frequency in the range from 0.2 MHz to 2 MHz, and the high frequency can be any frequency in the range from 10 MHz to 100 MHz.

The semiconductor manufacturing tool 402 also includes an RF phase controller 412 that controls the phases of low frequency RF generators 404 and 424. As described in more detail below with reference to FIGS. 6A to 6D, the low frequencies generated at the top and bottom electrode have a phase difference that is controlled by RF phase controller 412. In one embodiment, RF phase controller 412 tracks the phase of RF generator 424 and determines the desired phase for the RF generator 404 at the top electrode 406. Once the phase for the RF generator 404 is tracked, RF phase controller 412 generates a signal to set the phase of RF power source 404 to the desired phase. This way, the phase difference between the low RF power generators is controlled and set to the desired value. It is referred to herein as having the phase of one signal tracked to the phase of the other signal when the phase of one signal is based on the phase of the other signal, but both signals are not required to be synchronously at the same phase. In other words, the maximum value for one of the signals follows a predetermined amount of time from the maximum of the other signal. More specifically, as described in detail below, the minimum value of one signal follows a predetermined amount of time after the maximum of the other signal.

In other embodiment, RF phase controller reads the phase of the frequency generated at RF generator 404 and sends a control signal to control the phase of RF generator 424. In yet another embodiment, RF phase controller 412 controls both RF generator 404 and RF generator 424 so the desired phase difference is achieved by the system.

The system interface 420 provides an interface to access and control modules of the semiconductor manufacturing tool 402. The system interface includes connections to facilities 414, such as networking, gas sources, gas exhausts, vacuum, temperature control, etc. In one embodiment, system interface is configured via a recipe 426, which includes the chamber's parameters settings for the operation of the chamber, such as temperature, pressure, power levels for the top and bottom electrodes, chemistry flow rate, timing, facility interface, etc. Recipe 426 also includes information for configuring the RF phase controller 412, including the desired phase difference between the low frequencies generated at the top and bottom electrodes.

Figure 5A:
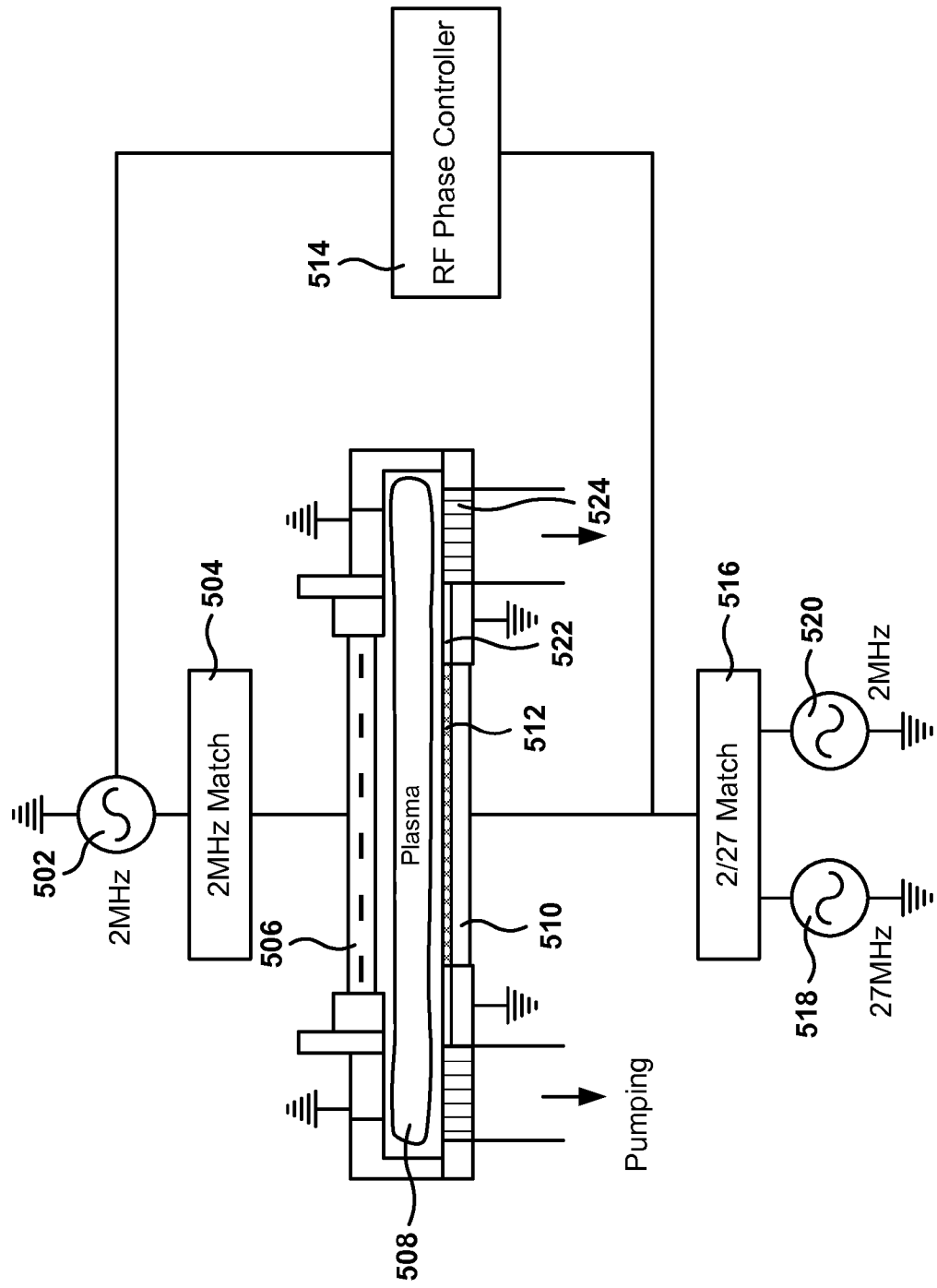
FIGS. 5A and 5B illustrate embodiments of CCP chambers with negative ion control.
Figure 5B:
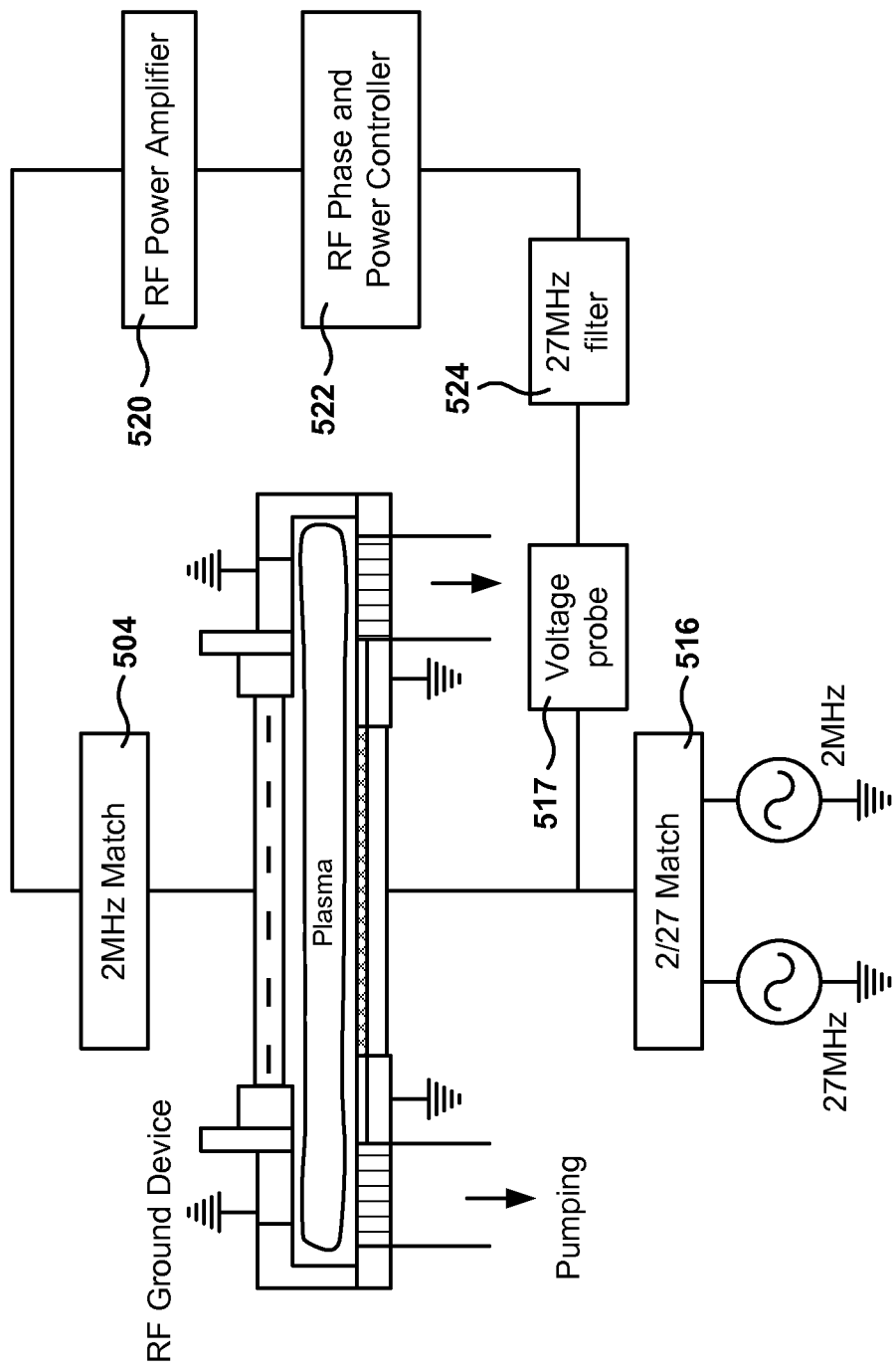

FIGS. 5A and 5B illustrate embodiments of capacitively-coupled plasma chambers with negative ion control. The chamber of FIG. 5A includes a top electrode powered by low-frequency RF generator 502, and a bottom electrode powered by low-frequency RF generator 520 and high-frequency RF generator 518. The top electrode RF generator 502 is connected to matching network 504. The bottom electrode is connected, via matching network 516, to the low-frequency RF generator 520 and to the high-frequency RF generator 518. RF phase controller 514 receives the output from the matching network 516, and analyzes the phase of the low frequency generated. Based on the phase of the low-frequency generated at the bottom electrode, RF phase controller 514 adjusts the phase of RF generator 502 at the top electrode, such that the low frequencies generated at the top and the bottom electrodes have the desired phase difference.

The chamber of FIG. 5A includes a gas showerhead on the top electrode to input gas in the chamber, and a perforated confinement ring 524 that allows the gas to be pumped out from the chamber. When substrate 512 is present in the chamber, dielectric focus ring 522 is situated next to the substrate such that there is a continuous surface below the plasma 508 for uniform etching on the surface of the wafer.

The embodiment of FIG. 5B is similar to the embodiment of FIG. 5A, except the there is only one low frequency RF generator in the chamber of FIG. 5B. To provide the low-frequency RF to the top electrode, a high voltage probe 517 is connected to the output of the matching network 516. In this embodiment, the high frequency filter 524 filters out the high frequency signal (27 MHz) generated by the high frequency RF generator.

RF phase and power controller receives the output from filter 524 and adjusts the received low frequency signal by controlling the phase and power of the signal output from RF phase and power controller 522. Thus, the signal output by RF phase and power controller 522 is a low frequency signal with the same frequency as the signal generated by the low frequency generator, but with the desired phase difference and voltage level. RF power amplifier 520 amplifies the signal received by RF phase and power controller 522, and the signal is then fed to the top electrode through the matching network 504.

Therefore, the chamber of FIG. 5B includes top and bottom electrodes powered by the same low frequency RF power generator. However, the low frequency signals for the top and bottom electrodes have a desired phase difference, and the voltage of the signals is also independent. In one embodiment, the voltage of the signal at the bottom electrode is bigger than signal at the top electrode, although other ratios between the two signals are possible.

Figure 6A:
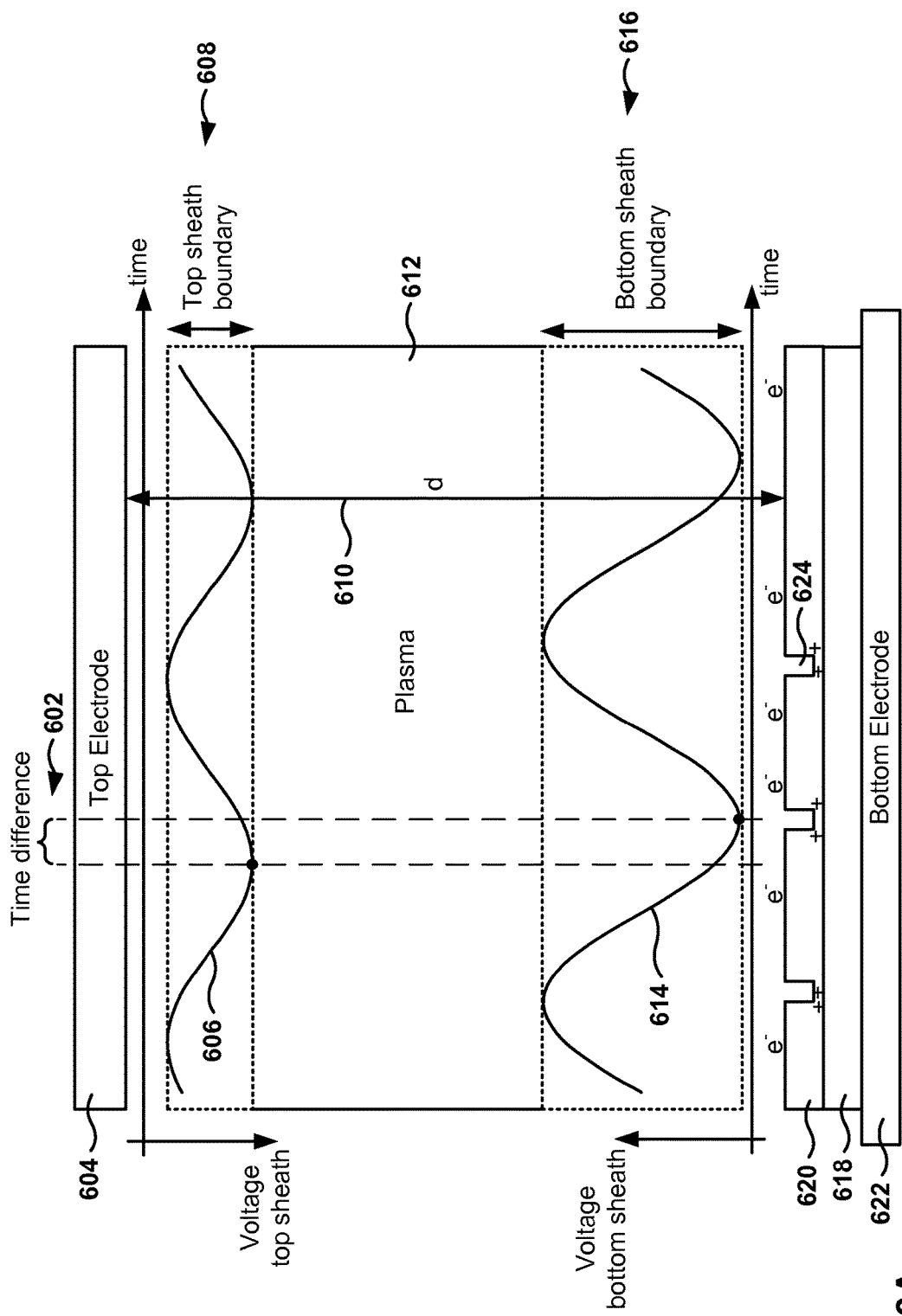

FIGS. 6A-6E illustrate the operation of the etching chamber at different times in the RF power cycle, according to one embodiment. Embodiments of the invention provide a flux of both positive and negative ions to the surface of the wafer surface for etching. FIGS. 6A-6D illustrate the process for etching with negative ions, and FIG. 6E illustrates etching with positive ions. It should be noted that FIGS. 6A-6E show the low frequency signals generated at the top and bottom electrode. The high frequency signals have been omitted for ease of description.

In one embodiment, a low RF frequency is applied to the top electrode with phase lock to the signal at the bottom electrode, such that the negative ions born at the top sheath travel through the plasma bulk and approach the surface of wafer when the bottom wafer sheath potential is at its minimum, or near its minimum. It is referred to herein as a phase lock between the signals at the top and bottom electrode, when the RF signals powering the top and bottom electrodes have a desired phase difference. Thus, the phase lock does not necessarily mean that both signals have the same phase, only that the phase difference between the two signals is predetermined and constant when operating the chamber.

Embodiments of the invention produce a flux of negative ions, having a broad energy distribution, which are delivered to the surface of the wafer without having to extinguish the plasma, as is the case in pulsed plasma chambers. The ion transit time is the time required by a negative ion to cross the plasma 612 and bottom sheath 616, i.e., the time required by the negative ion born at the top sheath to reach the bottom electrode. The goal is to have the negative ions reach the bottom sheath when the bottom sheath is at the lowest RF potential. FIG. 6A shows a chamber with independent RF power supplies in the top and bottom electrodes. The phases of the RF power signals is controlled, such that the negative ions are created at the top electrode 604 when the top electrode is at the maximum potential 606, and the negative ions reach the substrate 620 when the bottom electrode potential 622 is at a minimum. It is noted that the boundary 608 of the top sheath changes as the potential of the top sheath 606 changes, and the boundary of the bottom sheath 616 changes as the potential of the bottom sheath 614 changes.

Wafer 618 has a top layer 620 where the etching is taking place. The top layer 620 includes a mask layer on top of the layer that contains the features to be etched. For example, contact holes 624 are the areas that do not have mask material and where the etching is desired.

Time difference 602 shows the time required for the negative ions to go from the top sheath to the bottom sheath. In one embodiment, the distance d 610 between the top electrode and wafer 620 is used to calculate the traveling time for the negative ions, as an approximation for the distance between the top sheath and the bottom sheath. In another embodiment, the distance used to calculate the traveling time is the distance between the top sheath when the top electrode is at the maximum potential and the bottom sheath when the bottom sheath is at the lowest potential. See below for a description with reference to FIG. 8, detailing the calculation of the travel time for the negative ions from the top sheath to the bottom sheath.

As the negative ions are accelerated onto the surface of the wafer, some of the negative ions will enter contact holes 624 in the top surface of the wafer 620 to perform the etching. The negative ions penetrate into the contact holes and neutralize any positive charge accumulated at the bottom of the contact holes.

Figure 6B:
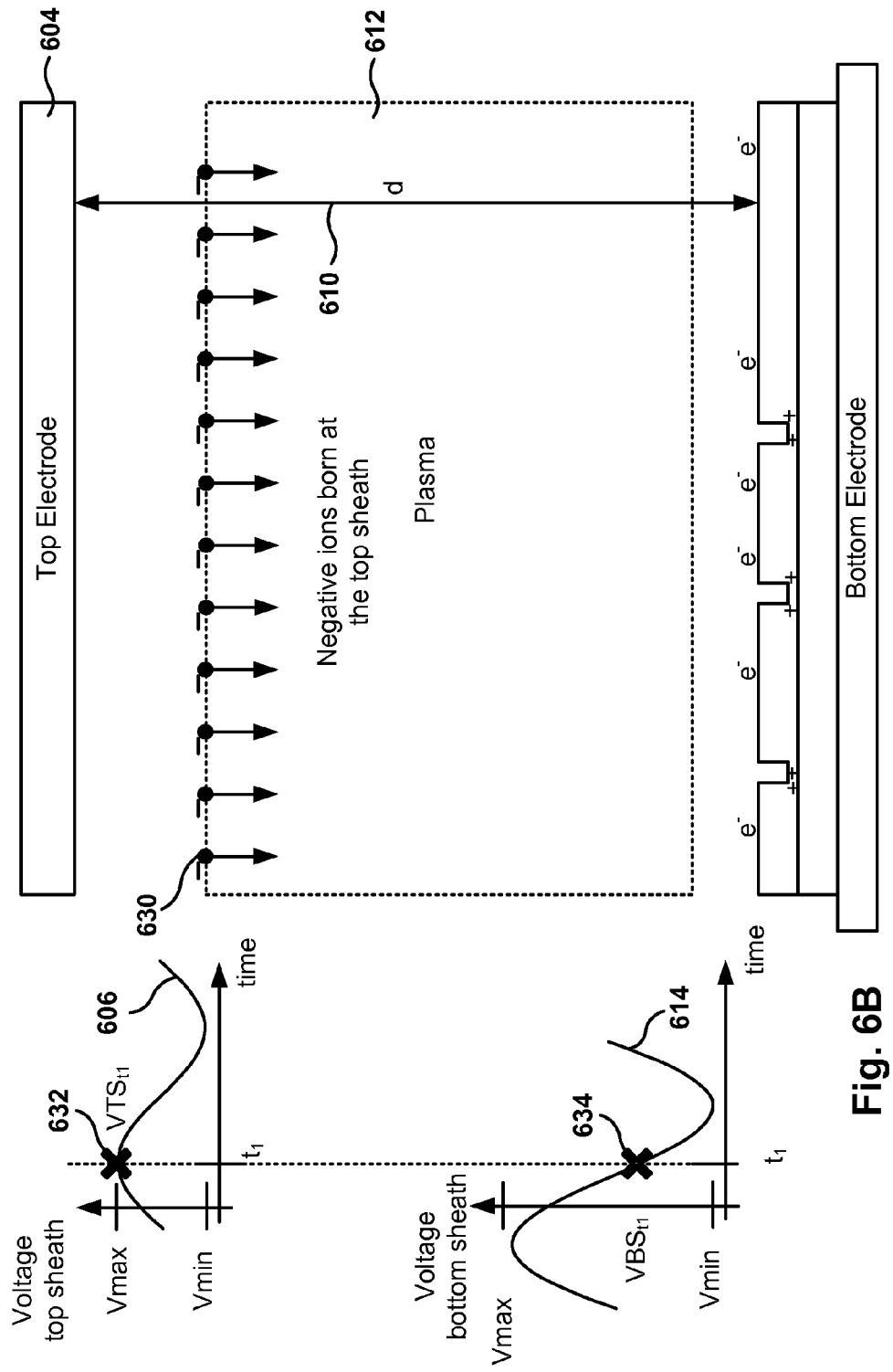

FIG. 6B shows the chamber at a time $t_1$ when the potential 606 of the top electrode is at a maximum 632 $VTS_{t1}$. At this time $t_1$, the voltage $VBS_{t1}$ 634 of the bottom electrode has not reached its minimum yet. The negative ions 630 are being born at the top of the sheath and start traveling through the plasma 612 towards the bottom sheath. It is noted that the negative ions are not just present at the top of the sheath, as there is always some density of negative ions throughout the plasma 612. However, for simplicity of description, a high level of negative ions is shown being born at the top of the sheath when the potential at the top of the sheath is at its maximum.

FIG. 6C shows the chamber a later time $t_2$ following $t_1$, where the negative ions 630, that were born at the top sheath in $t_1$, are now traveling through the plasma 612 towards the bottom sheath. As the negative ions travel through the sheath, the negative ions are accelerated, and when the negative ions reach the bottom sheath they have enough energy to escape the plasma and reach the surface of the wafer.

At time $t_2$, the voltage of the top sheath 606 has a value of $VTS_2$ 636, which is less than the maximum voltage at the top sheath. The voltage of the bottom sheath 614 has a value $VBS_2$ 638 that is approaching the minimum voltage but that hasn't reached the minimum yet.

Figure 6D:
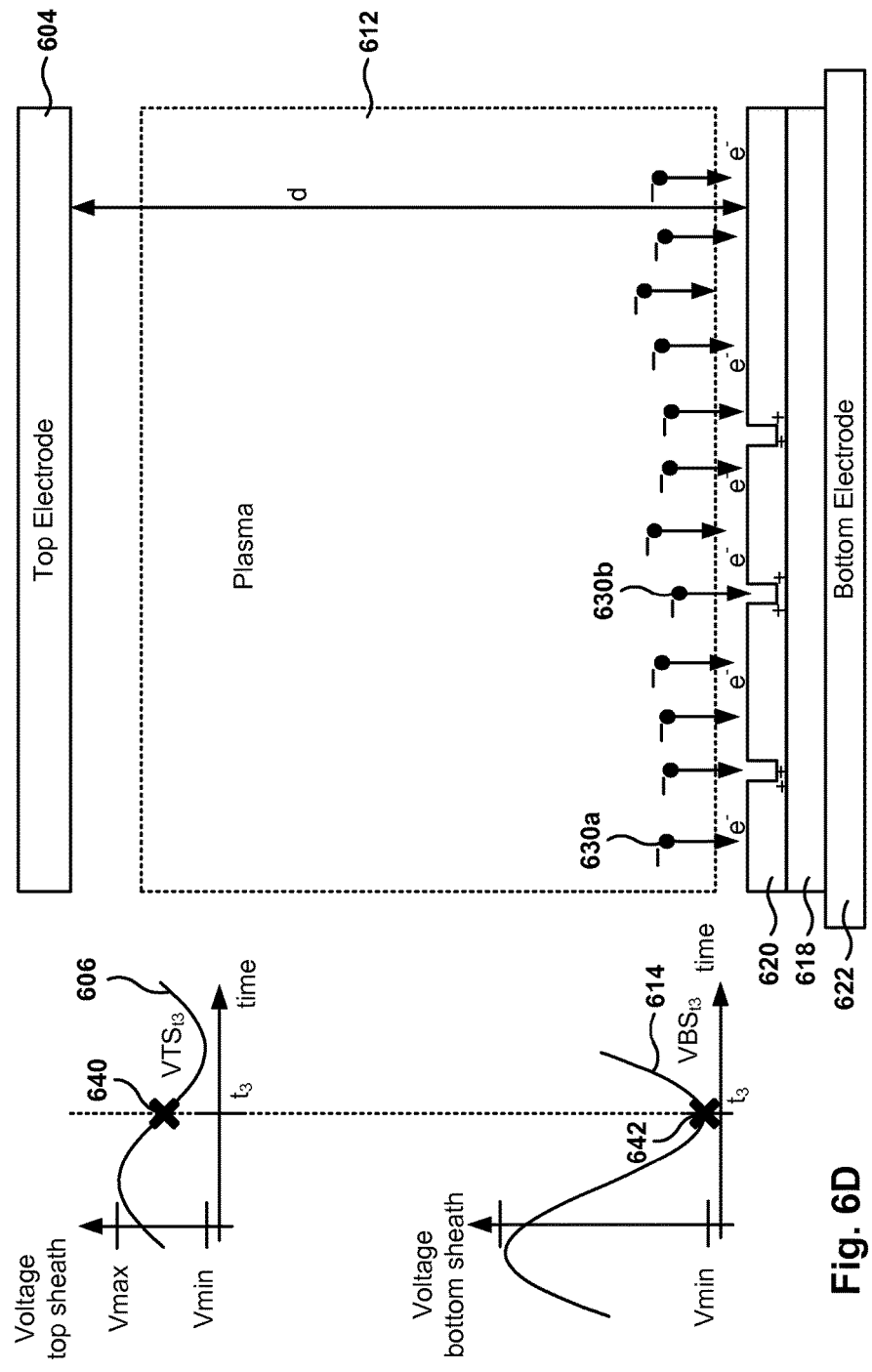

FIG. 6D shows the chamber at time $t_3$, with the negative ions arrive at the bottom of the plasma when the potential of the bottom sheath is at its minimum. At time $t_3$, the voltage $VBS_{t3}$ 642 is the minimum voltage of the bottom sheath 614. Some of the negative ions reaching the bottom sheath will escape the plasma, and either impact the top surface of the wafer 630a, or enter some of the contact holes 630b in the top surface of the wafer. Due to the layer of mask material on the top of the wafer, the effect of the negative ions reaching the mask material is less than the effect of the negative ions that enter the contact holes, resulting in the etching of the desired features in the wafer.

FIG. 6E shows the effect of positive ions in the etching of the substrate. At time $t_4$, the voltage of the bottom electrode 614 is at its maximum $VBS_{t4}$ 652. As with the negative ions, some of the positive ions 654 will enter the contact holes, while other positive ions 656 will reach the mask material on the top of the substrate 620.

As shown in FIGS. 6A-6E, there is etching in the chamber by both positive ions and negative ions. Also, there may be some accumulation of positive ions at the bottom of the contact holes. When the negative ions reach the contact holes, there is a possible reaction with the positive ions that increases the etching effect. Also, by neutralizing the positive charge accumulated on the wall of contact hole, undesired effects, such as slowing of the etch rate with larger hole depth or twisting of the etch profile, are reduced.

Figure 7:
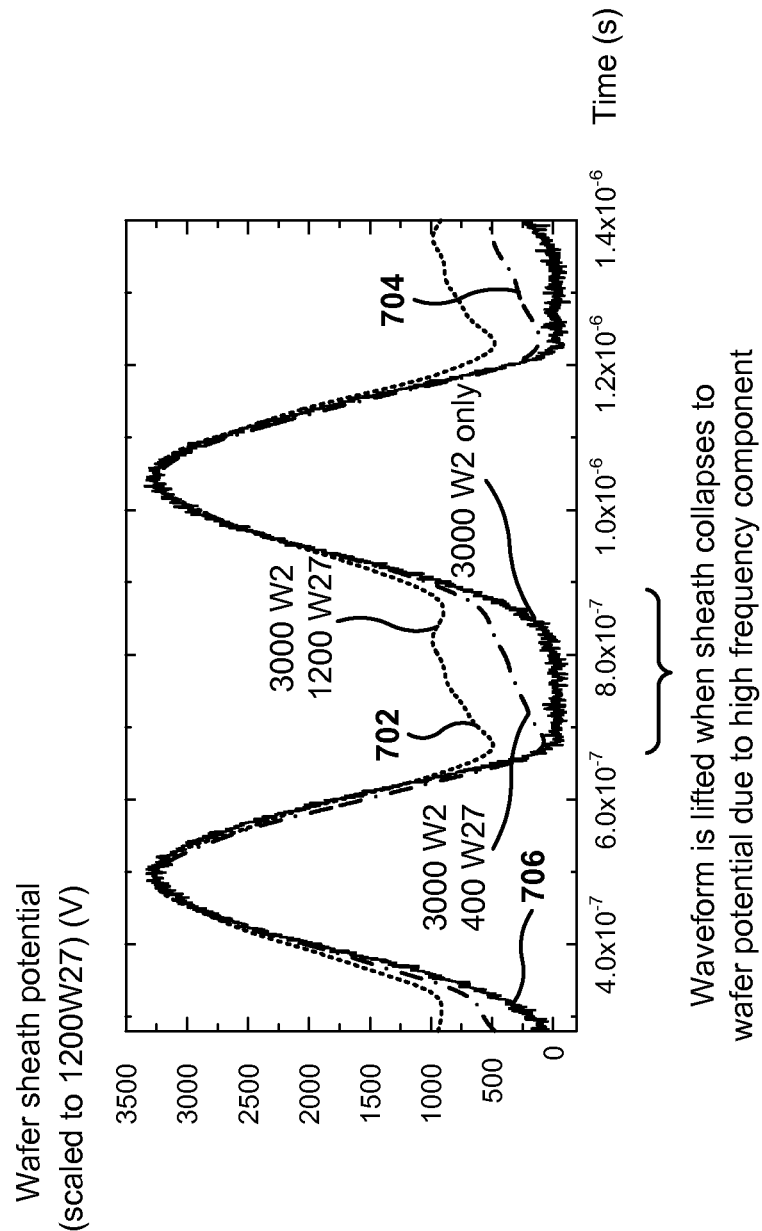
FIG. 7 show measurements of the wafer sheath potential in a dual frequency chamber, according to one embodiment.

FIG. 7 show measurements of the wafer sheath potential in a dual frequency chamber, according to one embodiment. Several measurements were taken in a plasma chamber, when different RF signals are fed to the chamber. When a high-frequency RF signal is introduced in the chamber simultaneously with the low-frequency RF signal, the voltage on the bottom sheath is slightly different from the ideal case previously described with reference to FIGS. 6A-6E. Three different measurements were taken in the chamber. The first measurement 706 was taken with a 3 kW 2 MHz RF power applied at the bottom electrode, without any high-frequency RF power in the chamber. The voltage of the bottom sheath, shows a valley around the minimum voltage for the signal that is approximately that of a symmetrical RF signal.

The second measurement 704 was taken with a 3 kW 2 MHz RF power source and a 400 W 27 MHz RF power source. The introduction of the high frequency RF shows that the low-frequency component of the bottom RF signal presents some deformation due to the presence of the high-frequency RF signal. The shape of the voltage at the bottom does not appear as low as in the case where no high-frequency RF power is applied.

The third measurement 702 was taken with a 3 kW 2 MHz RF power source and a 1200 W 27 MHz RF power source. As the power of the high frequency is increased, the deformation of the low-frequency component of the bottom RF signal increases. Therefore, the waveform is lifted when the sheath collapses to the water potential due to the high frequency component of the RF signal.

Nevertheless, even though the minimum for the potential at the bottom sheath is not as low as in the case when only the high-frequency is present, the negative ion flux to the wafer is still possible. In one embodiment, the phase difference between the top and bottom RF is adjusted based on the shape of the potential of the bottom sheath when the high-frequency RF is present. For example, in signal 702, the minimum of the sheath potential occurs before the minimum potential for the signal generated by the RF power source. In this case, the phase difference is adjusted so the negative ions arrive at the bottom sheath when the potential is lowest, and not when the potential of only the low-frequency RF is at its lowest value.

Figure 8:
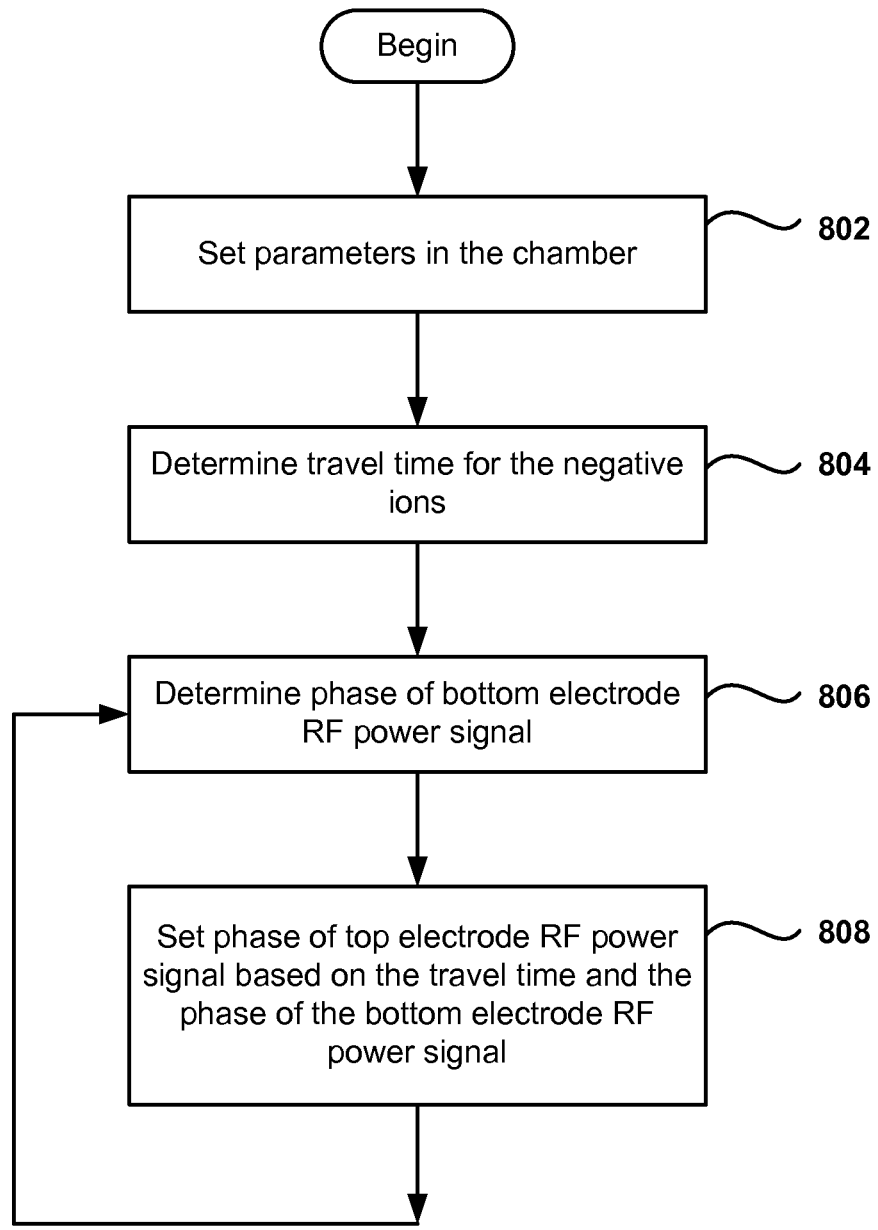
FIG. 8 shows a flowchart illustrating an algorithm for adjusting the phase of the top-electrode RF signal in relation to the phase of the bottom-electrode RF signal.

FIG. 8 shows a flowchart illustrating an algorithm for adjusting the phase of the top-electrode RF signal in relation to the phase of the bottom-electrode RF signal. The travel time for the negative ions on the sheath is a function of several factors, including the gap d between the electrodes, the upper sheath voltage V, the mass m of the negative ion, the pressure in the chamber, etc.

In the case of a fluorine negative ion $F^-$, the mass $m_f$ of the negative ion is $19 \times 1.67 \times 10^{-27}$ kg. Furthermore, the charge e of the electron taken positively is $1.6 \times 10^{-19}$ C. The relationship between the charge e of the electron, the velocity v, the mass $m_f$, and the voltage V is determined according to the following formula:

$$eV = \frac{m_f v^2}{2}$$

Therefore, the velocity v can be expressed as follows:

$$v = \sqrt{\frac{2\,eV}{m_f}}$$

Therefore, for a sheath voltage V of 100 Volts, the velocity of the negative ion is:

$$v = \sqrt{\frac{2 \times 1.6 \times 10^{-19} \times 100}{19 \times 1.67 \times 10^{-27}}} = 3.2 \times 10^4 \text{ m/s}$$

If the gap d between electrodes is 32 mm, the travel time t is calculated as follows:

$$t = \frac{d}{v} = \frac{0.032}{32000} = 1 \ \mu\text{sec}$$

Therefore, the phase of the low frequency RF signal in the top electrodes is controlled such that, the maximum voltage for the RF frequency on the top electrode occurs a time t (1 μsec in this example) seconds ahead of the time corresponding to the minimum voltage for the RF frequency on the bottom electrode.

The negative ions traveling across the electrode gap experience multiple collisions with neutral and charged particles present in the plasma. If the sheath phase delay conditions discussed above are met, the negative ion flux delivered to the bottom electrode can be estimated as:

$$\Gamma_b = \Gamma_t(0)\exp\left(-\frac{d}{\lambda}\right)$$

where $\Gamma_t$ is the negative ion flux born at the upper electrode, d is the electrode spacing, and $\lambda$ is the negative ion mean free path. Since negative ions experience collisions with both charged and neutral gas species, the mean free path is a complex function of the neutral gas density, the density of positive and negative ions, and the cross sections for ion-neutral and ion-ion collisions. The cross sections for ion-ion collisions are significantly larger than the collisions with neutrals. However, in typical capacitive plasma chambers with low degree of ionization, the neutral gas density dominates. As follows from the formula, it is advantageous to use smaller electrode gaps to maximize the negative ion flux to the wafer since the flux decays exponentially with the distance.

Referring back to FIG. 8, a method is presented for adjusting the phase of the top-electrode RF signal in relation to the phase of the bottom-electrode RF signal. In operation 802, the parameters of the chamber are set. Such parameters include the voltage of the RF signals, the distance between the top and bottom electrode, the pressure on the chamber, the phase difference between the low-frequency RF signals for the top and bottom electrodes, etc. From operation 802, the method continues to operation 804, where the travel time for the negative ions is determined. As discussed above, the travel time is determined based on the different parameters of the chamber, such as the mass of the negative ion, the distance for the negative ion to travel to cross the plasma, etc.

Once the travel time is established, in operation 806 the method determines the phase of the bottom electrode RF power signal. After operation 806, the method continues to operation 808, where the phase of the top electrode RF power signal is set based on the travel time, and on the phase of the bottom electrode RF power signal. In one embodiment, an iterative method is utilized to further refine the value of the phase difference. After an initial setting is determined for the phase difference, measurements are taken on the chamber regarding etching performance, such as concentration of negative ions in the plasma, concentration of positive ions in the plasma, feature quality, etc. The results with the performance measurements are then compared, and the value of the phase difference that produces the best etching results is selected.

It is noted that the embodiment illustrated in FIG. 8 is exemplary. Other embodiments may utilize different adjustments to synchronize the phases of the low frequency RF power signals, or control the phase of the bottom electrode signal based on the phase of the top electrode signal, etc. The embodiments illustrated in FIG. 8 should therefore not be interpreted to be exclusive or limiting, but rather exemplary or illustrative.

Figure 9:
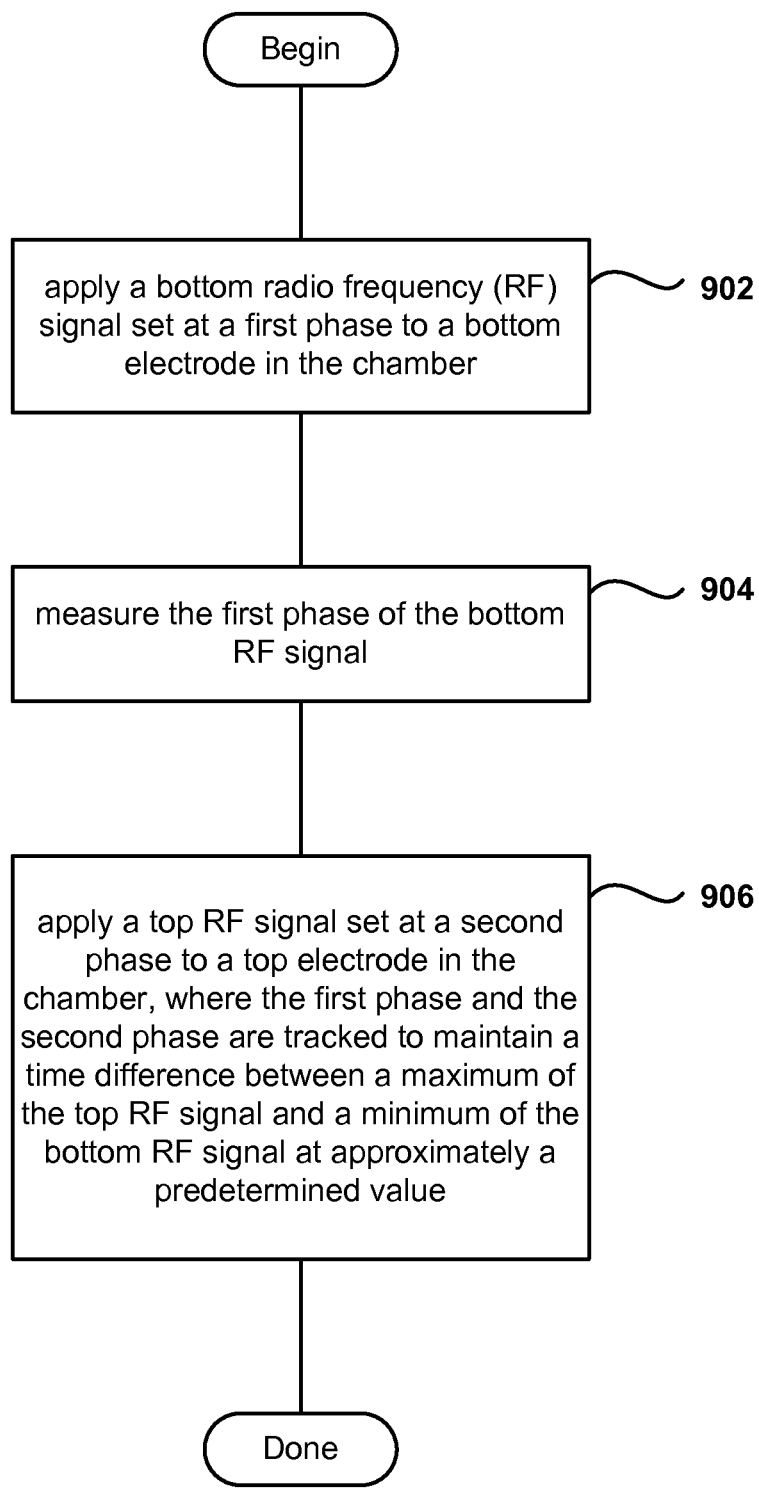
FIG. 9 shows a flowchart illustrating an algorithm for negative ion control in a capacitively-coupled plasma chamber, in accordance with one embodiment of the invention.

FIG. 9 shows a flowchart illustrating an algorithm for negative ion control in a capacitively-coupled plasma chamber, in accordance with one embodiment of the invention. In operation 902, a bottom radio frequency (RF) signal with a first phase is applied to the bottom electrode in the chamber. In one embodiment, a second high-frequency RF signal is also applied to the bottom electrode. See for example, the chambers presented in FIGS. 4, 5A, and 5B.

From operation 902 the method flows to operation 904, where the first phase of the bottom RF signal is measured. In one embodiment, the phase of the bottom RF signal is provided to an RF phase controller, such as the one in FIG. 4, by the bottom RF power source. In another embodiment, the RF phase controller examines the signal coming out of a matching network, which includes filtering the high frequency RF signal, to determine the phase of the low frequency RF signal being generated for the bottom electrode. In yet another embodiment, the phase of the RF signal is communicated from the RF phase controller to the RF power source, which then generates the bottom RF signal with the desired phase.

Further, a top RF signal with the second phase is applied to the top electrode in the chamber in operation 906. In one embodiment, the phase of the top RF signal is controlled by the RF phase controller, which provides the value of the desired phase to the top RF signal generator. In another embodiment, such as the one presented in FIG. 5B, the bottom RF signal is processed to generate the top RF signal, and this way the second low-frequency RF generator is not needed in the chamber. The RF phase controller receives the bottom RF signal, and generates a top RF signal with the desire phase difference. The RF power amplifier adjusts the amplitude for the top RF signal if necessary. The first phase and the second phase are tracked to maintain the time difference between the maximum of the top RF signal and the minimum of the bottom RF signal at approximately a constant predetermined value. In one embodiment, tracking includes periodically measuring the phase of the bottom RF signal. Every time the phase of the bottom RF signal is measured, the phase of the top RF signal is adjusted, if necessary.

In one embodiment, the time difference is base on the time required for negative ions to travel from the top of the chamber to the bottom of the chamber. However, this time difference can be farther fine-tuned by measuring the performance of the chamber utilizing different time differences, and then selecting the time difference that provides the best results. In yet another embodiment, a user selects, via a Graphical User Interface, the time difference for the top and bottom RF signals.

Figure 10:
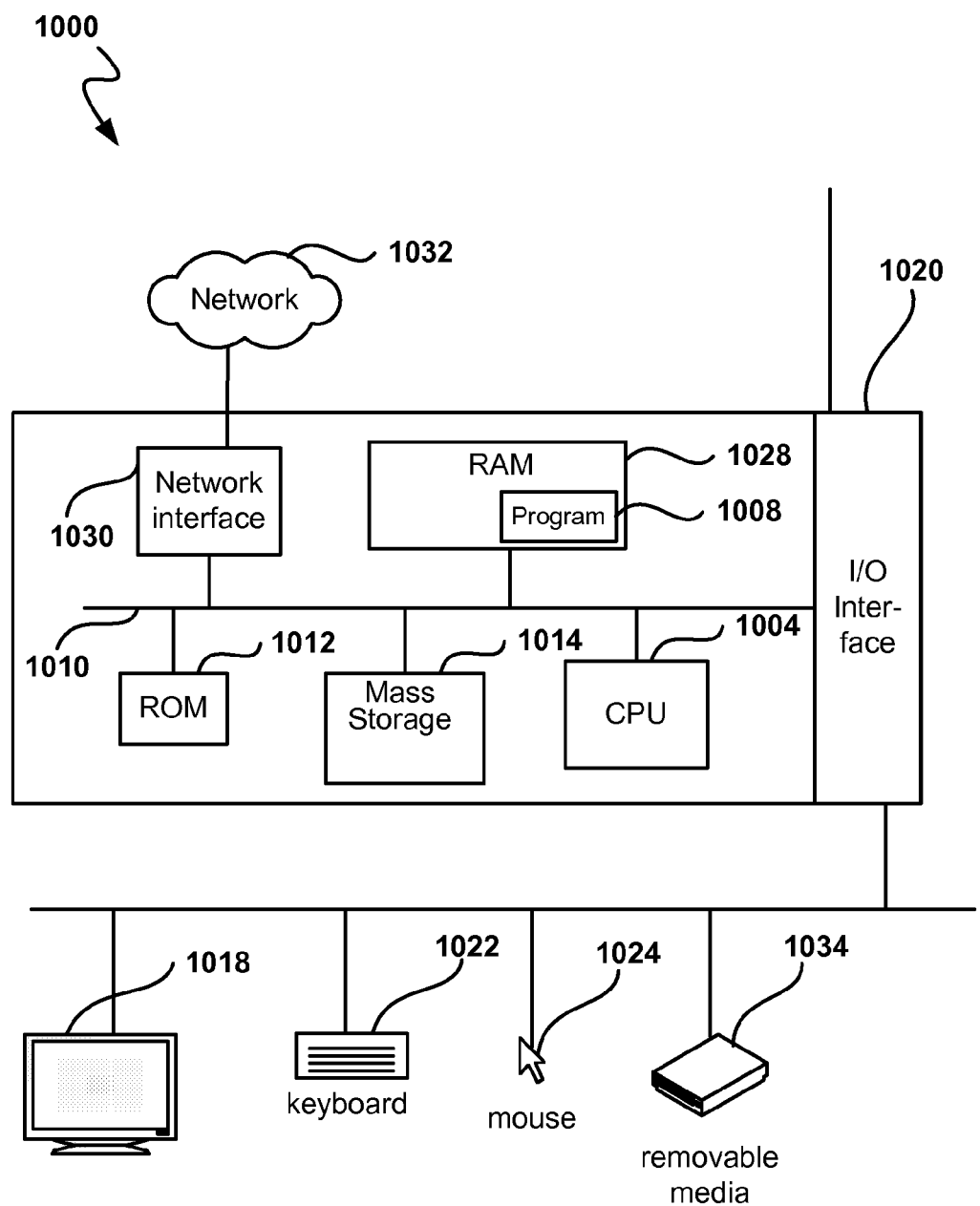
FIG. 10 is a simplified schematic diagram of a computer system for implementing embodiments of the present invention.

FIG. 10 is a simplified schematic diagram of a computer system for implementing embodiments of the present invention. It should be appreciated that the methods described herein may be performed with a digital processing system, such as a conventional, general-purpose computer system. Special purpose computers, which are designed or programmed to perform only one function, may be used in the alternative. The computer system includes a central processing unit (CPU) 1004, which is coupled through bus 1010 to random access memory (RAM) 1028, read-only memory (ROM) 1012, and mass storage device 1014. Phase control program 1008 resides in random access memory (RAM) 1028, but can also reside in mass storage 1014 or ROM 1012.

Mass storage device 1014 represents a persistent data storage device such as a floppy disc drive or a fixed disc drive, which may be local or remote. Network interface 1030 provides connections via network 1032, allowing communications with other devices. It should be appreciated that CPU 1004 may be embodied in a general-purpose processor, a special purpose processor, or a specially programmed logic device. Input/Output (I/O) interface provides communication with different peripherals and is connected with CPU 1004, RAM 1028, ROM 1012, and mass storage device 1014, through bus 1010. Sample peripherals include display 1018, keyboard 1022, cursor control 1024, removable media device 1034, camera 1040, etc.

Display 1018 is configured to display the user interfaces described herein. Keyboard 1022, cursor control 1024, removable media device 1034, and other peripherals are coupled to I/O interface 1020 in order to communicate information in command selections to CPU 1004. It should be appreciated that data to and from external devices may be communicated through I/O interface 1020. The invention can also be practiced in distributed computing environments where tasks are performed by remote processing devices that are linked through a wire-based or wireless network.

Embodiments of the present invention may be practiced with various computer system configurations including hand-held devices, microprocessor systems, microprocessor-based or programmable consumer electronics, minicomputers, mainframe computers and the like. The invention can also be practiced in distributed computing environments where tasks are performed by remote processing devices that are linked through a network.

With the above embodiments in mind, it should be understood that the invention can employ various computer-implemented operations involving data stored in computer systems. These operations are those requiring physical manipulation of physical quantities. Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data maybe processed by other computers on the network, e.g., a cloud of computing resources.

The embodiments of the present invention can also be defined as a machine that transforms data from one state to another state. The transformed data can be saved to storage and then manipulated by a processor. The processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

One or more embodiments of the present invention can also be fabricated as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for operating a capacitively-coupled plasma in a chamber having a bottom electrode and a top electrode, the method comprising:
    applying a bottom radio frequency (RF) signal set at a first phase to the bottom electrode in the chamber;
    calculating, for an etch process and a distance between the top electrode and bottom electrode, a travel time for negative ions formed in the chamber to reach the bottom electrode; and
    applying a top RF signal to the top electrode in the chamber, wherein the first phase and a second phase are adjusted to maintain a time difference between a maximum of the top RF signal and a minimum of the bottom RF signal, the time difference is set based on the calculated travel time for the negative ions,
    wherein the first phase and the second phase are adjusted so that the minimum of the bottom RF signal is offset from the first phase producing the maximum of the top RF signal based on the calculated travel time between the top electrode and bottom electrode.

2. The method as recited in claim 1, wherein said negative ions are formed near a top plasma sheath of a plasma that is proximate to the top electrode in the chamber and said negative ions travel to a bottom plasma sheath of the plasma proximate to the bottom electrode over which the substrate is disposed during operation.

3. The method as recited in claim 2, further comprising, calculating a velocity of the negative ions travelling in the plasma, the travel time is the distance divided by the velocity of the negative ions.

4. The method as recited in claim 3, wherein the velocity of the negative ions is calculated as $$v = \sqrt{\left(\frac{2\,eV}{m_f}\right)},$$

wherein e is a charge of an electron, V is a voltage of an upper sheath, and $m_f$ is a mass of a negative ion.

5. The method as recited in claim 1, wherein negative ions are formed near a top plasma sheath when the top RF signal has a value of the maximum of the top RF signal, wherein the negative ions arrive at a bottom plasma sheath when the bottom RF signal has a value of the minimum of the bottom RF signal.

6. The method as recited in claim 1, wherein the top signal and the bottom RF signal have a frequency between 0.2 MHz and 2 MHz.

7. The method as recited in claim 1, wherein,
    the top RF signal is a first low frequency signal and the bottom RF signal is a second low frequency signal, the bottom electrode further having a high frequency signal.

8. The method as recited in claim 1, wherein the chamber is configured to generate positive ions when the bottom RF signal approaches or is at a maximum value.

9. A method for operating a chamber that generates a capacitively-coupled plasma, the method comprising:
    applying a bottom radio frequency (RF) signal to a bottom electrode in the chamber, the bottom RF signal set at a first frequency at a first phase;
    applying a top RF signal at the first frequency to a top electrode in the chamber, the top electrode set at a distance from the bottom electrode;
    calculating a travel time required for negative ions formed near a top plasma sheath in the chamber to travel the distance towards the bottom electrode;
    determining a second phase for the top RF signal based on the travel time based on a time offset between a maximum of the top RF signal and a minimum of the bottom RF signal for the travel time; and
    using the second phase for the top RF signal while using the first phase for the bottom RF signal.

10. The method as recited in claim 9, wherein the negative ions are formed near the top plasma sheath when the top RF signal is at said maximum, wherein the negative ions are configured to arrive at a bottom plasma sheath when the bottom RF signal is at said minimum.

11. The method as recited in claim 9, further including:
    applying a high frequency RF signal to the bottom electrode,
    wherein the top RF signal and the bottom RF signal are low frequency RF signals, wherein the high frequency RF signal has a frequency of about 27 MHz,
    wherein the top RF signal and the bottom RF signal each have a frequency of about 2 MHz.

12. The method as recited in claim 9, wherein the top RF signal and the bottom RF signal each has a frequency between 0.2 MHz and 2 MHz.

13. The method as recited in claim 9, wherein the chamber is configured to generate positive ions when the bottom RF signal has about a maximum value.

14. The method as recited in claim 9, wherein the distance between the top electrode and the bottom electrode is between 15 mm and 100 mm.

15. The method as recited in claim 9, wherein the travel time is calculated as the distance between the top electrode and the bottom electrode divided by a velocity of a negative ion travelling in the plasma.

16. The method as recited in claim 15, wherein the velocity of the negative ions is calculated as $$v = \sqrt{\left(\frac{2\,eV}{m_f}\right)},$$

wherein e is a charge of an electron, V is a voltage of an upper sheath, and $m_f$ is a mass of a negative ion.

* * * * *